United States Patent [19]

Kim

[11] Patent Number: 5,619,058
[45] Date of Patent: Apr. 8, 1997

[54] LIGHT EMITTING DIODE DEVICE HAVING FOUR DISCRETE REGIONS

[75] Inventor: Helen H. Kim, Holmdel, N.J.

[73] Assignee: Lucent Technologies Inc., Murray Hill, N.J.

[21] Appl. No.: 197,895

[22] Filed: Feb. 17, 1994

[51] Int. Cl.$^6$ .............................. H01L 27/14; H01L 31/00
[52] U.S. Cl. .............................. 257/431; 257/40; 257/79; 257/98
[58] Field of Search .............................. 257/431, 40, 79, 257/98

[56] References Cited

U.S. PATENT DOCUMENTS

| | | | |
|---|---|---|---|
| 5,172,385 | 12/1992 | Forrest et al. | 257/431 |
| 5,220,445 | 6/1993 | Takenaka et al. | 257/431 |
| 5,362,977 | 11/1994 | Hunt et al. | 257/98 |

FOREIGN PATENT DOCUMENTS 1012439  12/1965  United Kingdom ................. 257/79

*Primary Examiner*—Mahshid D. Saadat
*Assistant Examiner*—T. M. Arroyo
*Attorney, Agent, or Firm*—Richard J. Botos

[57] ABSTRACT

An integrated circuit device with a light-emitting diode thereon is disclosed. The device has discrete regions which function in concert to emit light when a suitable amount of voltage is provided. The device has four discrete regions: a first doped silicon region; a second silicon dioxide region; a third organic material region; and a fourth conducting material region. The first and fourth regions are electrodes which inject holes and electrons into the conducting organic material. The second region lowers the energy barrier between the first and third regions which improves the efficiency with which the polymer emits light. The diode of the present invention is fabricated on an integrated circuit using conventional integrated circuit fabrication techniques.

9 Claims, 2 Drawing Sheets

LIGHT EMITTING DIODE DEVICE HAVING FOUR DISCRETE REGIONS

BACKGROUND OF THE INVENTION

1. Field of the Invention

The invention is directed to light-emitting-diodes (LEDs) and a process for fabricating these devices.

2. Art Background

Light-emitting diodes (LEDs) are a known means for generating an optical signal. An LED operates by applying a voltage to the LED which causes electrons and holes to inject into light-emissive material. The electrons and holes recombine in the light-emissive material and this radiative recombination results in the emission of light.

The amount of voltage required to bring about the desired radiative recombination depends in part upon the efficiency of the radiative recombination. The efficiency of the radiative recombination depends upon how closely the energy levels of the electrons and the holes match the energy levels of the conduction and valence bands, respectively, of the light emissive material in the LED. The closer the match, the less voltage that will be needed to achieve a certain level of light emission from a particular light-emitting material.

The amount of voltage required for an LED to emit light is termed "turn-on" voltage. The turn-on voltage of an LED is a factor which determines whether an LED is suited for a particular application. Dresner, J., et al., "Anthracene Electroluminescent Cells with Tunnel Injection Cathodes", *Proceedings of the IEEE Letters*, pp. 1868–1869 (Nov. 1970) describes an electroluminescent cell in which anthracene is deposited either on a $n^+$-Si wafer covered with 20–40 Å of $SiO_2$ or aluminum evaporated on a glass substrate. The turn-on voltages for such an electroluminescent cell is about 60 to 400 volts, which is quite high. If such LED's are to be used in current devices, lower turn-on voltages are required.

SUMMARY OF THE INVENTION

The invention is directed to a light emitting diode formed on an integrated circuit device. The diode has at least four regions of different material formed on a substrate. The substrate is any material on which integrated circuits are formed, including silicon (Si) and gallium arsenide (GaAs). Typically, the substrate is silicon. The first region is a first electrode made of doped silicon. An electrode is a discrete portion of the device that emits either electrons or holes. The second region is a thin layer of silicon dioxide overlying the doped silicon. The third region is a light emission layer and is made of a luminescent organic material. The fourth region is a second electrode formed on the semiconducting organic material.

The diode is formed by doping a portion of the silicon with a suitable dopant to form the first electrode. The particular dopant used depends on whether the silicon is to be n-type silicon or p-type silicon. To obtain n-type silicon, donor impurities such as arsenic, antimony, and phosphorus are individually introduced into the silicon using known techniques. To obtain p-type silicon, acceptor impurities such as borondifluoride are introduced into the silicon. The amount of dopant introduced into the silicon is sufficient so that the maximum concentration of dopant in the silicon is in excess of $1 \times 10^{19}/cm^3$.

A thin layer of silicon dioxide is then grown on the silicon wafer. The silicon dioxide layer is about 20 Å to about 60 Å thick. The silicon dioxide layer is grown using conventional techniques.

A thin layer of luminescent organic material is applied onto the silicon dioxide layer. Conjugated polymers are suited for this purpose because they provide excellent charge transport characteristics and useful quantum efficiencies for luminescence. They also form relatively pin-hole free films when a film thereof is formed on the substrate. Suitable materials include polymers such as poly(phenylene-vinylene), examples of which are poly(2-methoxy,5-(2'-ethylhexyloxy)-p-phenylene-vinylene) (MEH-PPV), poly(2,5-bis(5,6-dihydro-cholestanoxy)-1,4-phenylene-vinylene) (BDCH-PPV), and cyano-substituted PPV. Other luminescent organic materials, such as organic coordination compounds are also contemplated as useful. These compounds also have excellent charge transport characteristics. One example of a suitable coordination compound is 8-hydroxyquinoline aluminum.

The luminescent organic material is applied using known techniques such as spinning or some other suitable technique for depositing a relatively pin hole free film on a substrate. The thickness of the layer of luminescent organic material that is spun on the substrate is about 500 Å to about 1000 Å.

The second electrode is then formed on top of the luminescent organic layer. The electrode material is any suitable metal or polymer with a conductivity of at least 10 S/cm. It is advantageous if the material is either transparent or semitransparent. Materials that have a light transmission efficiency of greater than 50 percent at the emission wavelength are contemplated as useful.

The dopant for the first electrode region and the material of the second electrode regions are selected to facilitate a radiative recombination of electrons in the semiconducting organic material. The radiative recombination of electrons in the luminescent organic material causes light to be emitted from this material. The material of the second electrode region, which overlies the luminescent organic material, is transparent or semi-transparent so that photons emitted from the organic material are actually emitted from the LED.

In order to facilitate the radiative recombination of electrons in the semiconducting material, the electrons and holes are injected into the luminescent organic material with an energy level that is somewhat close to the energy level of the conduction and valence bands, respectively, of the organic material. For example, if the second electrode is negatively biased and functions as a cathode, the material for the second electrode is selected so that the work function of the material is within about 2 eV of the energy level of the conduction band of the organic material. If the second electrode is positively biased and functions as an anode, the material for the second electrode is selected so that the work function of the material is within about 2 eV of the energy level of the valence band of the organic material.

The LED of the present invention has a turn-on voltage of less than 10 volts. The LED has an efficiency (number of photons out/number of electrons in) of at least about 0.01 percent.

DETAILED DESCRIPTION

Integrated circuits are commonly used to store and transmit a vast amount of information. The speed and efficiency by which information is transmitted from chip to chip must also be improved to accommodate the increased demands placed on integrated circuits. Optical signals are known as a means for the efficient transmission of information. In order to utilize optical signals to communicate on a chip or from chip to chip, an LED for generating such a signal on an integrated circuit and a process for fabricating such an LED is disclosed.

Figure 1:
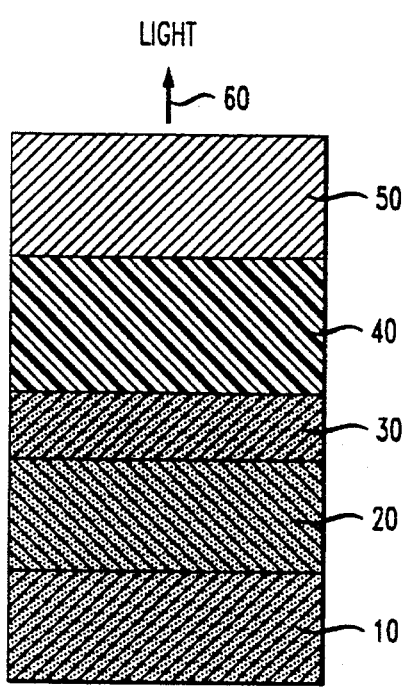
FIG. 1 is an illustration of a device of the present invention.

Referring to FIG. 1, the device has several layers of material which together perform the desired light-emitting function. The device is formed on a silicon substrate 10. A first region of doped silicon 20 is formed on the silicon substrate by doping a certain portion of the silicon with an n-type or a p-type dopant. Examples of n-type dopants are arsenic, antimony, and phosphorus. Examples of p-type dopants are boron or borondifluoride.

The silicon is doped using known techniques as disclosed in Sze, S. M., *VLSI Technology*, pp. 219–264 (1983) which is hereby incorporated by reference. The dopant concentration is contemplated as greater than $1 \times 10^{19} /cm^3$. The doped silicon 20 functions as an electrode in the LED. If the silicon is doped with a p-type dopant (an electron acceptor) the silicon is positively biased and functions as an anode. If the silicon is doped with an n-type dopant, the silicon is negatively biased and functions as a cathode.

The second region 30 is a thin layer of silicon dioxide or other dielectric. The silicon dioxide is formed on the silicon using known techniques. One such technique is to heat the silicon wafer to about 800° C. in the presence of dry oxygen for about 10 minutes. The flow rate of oxygen is contemplated to be about 2 liters per minute. The wafers are then annealed at a temperature of about 800° C. for about 10 minutes under nitrogen ($N_2$) gas flowing at a rate of about 3l/minute. The thickness of the silicon dioxide so grown is about 20 Å to about 60 Å.

A luminescent organic material 40 is deposited on the silicon dioxide region 30. The luminescent organic material theoretically has a quantum efficiency of up to about 25 percent. The luminescent organic material forms the third region, which functions as an emission layer in the device.

The luminescent organic material is an organic polymer such as, for example, poly(phenylene-vinylene) or one of its derivatives, e.g., poly(2-methoxy, 5-(2'ethyl-hexyloxy)-p-phenylene-vinylene)(MEH-PPV). Another example of a suitable polymer is poly(2,5-bis (5,6-dihydro-cholestanoxy)-1,4-phenylenevinylene). Suitable polymers are disclosed in U.S. Pat. No. 5,246,627 to Heeger et al., the teachings of which are incorporated by reference. Such polymers are obtained commercially from the Uniax Corporation, located in Santa Barbara, Calif.. It is also advantageous if the luminescent organic material is an organic coordination compound such as 8-hydroxyquinoline aluminum. The preparation of 8-hydroxyquinoline aluminum is disclosed in Holoick, L. C. and Trigg, W. W., "Homogeneous Precipitation of Aluminum 8-Quinolate," *Analytical Chemistry* 33(2): 302 (1961) which is hereby incorporated by reference. Such compounds are a complex of a metal ion and an organic ligand. If such a coordination compound is used, it is used in conjunction with an aromatic diamine such as N, N'-diphenyl-N, N'-bis (3-methylphenyl)-[1, 1'-biphenyl]-4, 4' diamine. The preparation of the diamine is described in Stolka, M., et al., "Hole Transport in Solid Solutions of a Diamine in Polycarbonate," *J. Phys. Chem.*, 88:4707 (1984), which is incorporated by reference into this disclosure. The thickness of the luminescent organic material is about 500 Å to about 1000 Å. If the luminescent organic material is a two-layer combination of a coordination compound and a diamine, the coordination compound layer thickness is about 250 Å to about 750 Å and the diamine layer thickness is about 250 Å to about 750 Å.

The silicon dioxide region 30 lowers the energy barrier between the first (doped silicon) region and the third (semiconducting organic material) region. The energy barrier is defined as the difference between the work function of the doped silicon material and either the conduction band or the valence band of the organic material. As illustrated by the band diagram in FIG. 2, if the doped silicon 20 is n-type silicon, the silicon dioxide increases the efficiency of the electron-tunneling from the doped silicon layer 20 to the conduction band of the organic material 40 by reducing the energy barrier between the work function 55 of the doped silicon (4.7eV) 20 and the conduction band 63 of the organic material 40. The energy barrier is lowered because when voltage is applied to the device, the oxide layer 30 maintains the potential difference between the organic layer 40 and the silicon 20, in effect using the energy level of electrons in the silicon layer 20. If the doped silicon 20 is p-type silicon, the silicon dioxide increases the efficiency of the injection of holes from the p-type silicon 20 into the valence band of the organic material in the third region, 40 by lowering the energy barrier between the work function of the silicon layer 20 and the energy level of the valence band 70 of the organic material. Since the work functions of n-type silicon and p-type silicon are similar, the silicon dioxide facilitates either electron tunneling or hole injection from the doped silicon into the organic material.

The second electrode 50 is a layer of metal or conducting polymer that is formed over the semiconducting organic material. One skilled in the art will appreciate that a variety of metals and polymers are available for use as the electrode material. Materials that are either transparent or semi-transparent are advantageous because the light that is emitted from the organic material will pass through the transparent or semi-transparent electrode. Since the second electrode is deposited over the organic material, it is important that the light that is emitted from the third region be transmitted through the fourth region in order for the LED of the present invention to emit light. The degree to which the fourth region is transparent depends on the material and its thickness. The thickness, in turn, depends on the transmission efficiency of the electrode material. It is contemplated that the metals used for the fourth region of the device of the present invention will have a light transmission efficiency of 50 percent or greater if the metal thickness is at least about 100 Å to 200 Å.

If a metal is selected for the second electrode, the metal is applied using known techniques such as evaporation or sputtering. If a polymer such as polyaniline is selected as the electrode material, it is applied on top of the luminescent polymer layer using conventional techniques such as spinning.

The first and second electrodes act in concert to inject electrons and holes into the third region to produce the desired light emissive effect. Therefore, it is contemplated that if the first electrode 20 is positively doped, then the second electrode 50 will be negatively biased. If the first electrode 20 is negatively doped, then the second electrode 50 will be positively biased.

Figure 2:
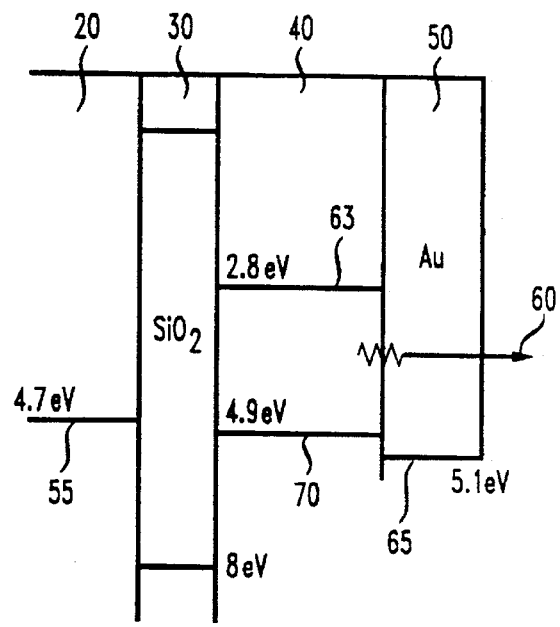
FIG. 2 is a band diagram of an embodiment of the present invention.

The material for the second electrode is selected so that its work function is proximate to the energy level of either the conduction band or the valence band of the organic material. For example, as illustrated in FIG. 2, if the organic material 40 is MEH-PPV and the second electrode 50 functions as an anode in the LED device, then gold is a suitable material for the second electrode because the energy barrier between its work function, 5.1 eV, 65 and the energy level of the valence band 70 of MEH-PPV 40, which is 4.9 eV, is sufficiently small (the barrier is less than 2 eV). Gold is also a suitable anode if the organic material is the two layer combination of 8-hydroxyquinoline aluminum and diamine because the energy barrier between the work function of gold, 5.1 eV, and the valence band of the diamine, 5.2 eV, is sufficiently small. The difference between the work function of the electrodes and the energy level of the applicable band of the luminescent organic material is less than about 2 eV in order to obtain LEDs that have at least about 0.01 percent quantum efficiency. Other materials with work functions that are sufficiently close to the energy level of the valence band of the above-identified materials include indium-tin oxide, aluminum, silver and an organic polymer such as polyaniline.

If the second electrode functions as a cathode and the organic material is MEH-PPV, then metals with a work function of about 2.8 eV to about 4.8 eV are selected because the conduction band of MEH-PPV is about 2.8 eV. Examples of metals with a suitable work function are calcium, magnesium, yittrium, indium, and aluminum. If the organic material is 8-hydroxyquinoline, then metals with a work function of about 2.5 eV to about 4.5 eV are selected because the conduction band of 8-hydroxyquinoline is about 2.5 eV. Metals such as calcium, magnesium, yittrium, and aluminum have work functions which make them suited for this application. Work functions of conducting and semiconducting materials are known to those skilled in the art. Work functions for most materials are enumerated in Michaelson, H. B., "Relation Between an Atomic Electronegativity Scale and the Work Function," *I.B.M. J. Res. Dev.*, 22:72 (1978), which is incorporated by reference.

The following examples illustrate certain embodiments of the invention. The example is not to be construed as limiting the invention in any way except within the spirit and scope of the appended claims.

EXAMPLE 1

A wafer of n-type silicon with a resistivity of about B 5to 10 ohm-cm was obtained. A layer of pad oxide that was about 120 Å thick was grown on the wafer. The oxide was grown by placing the wafer on a boat and placing it in the center of a furnace. The wafer was then heated to about 950° C. in the presence of dry oxygen for about 10 minutes. The wafer was then annealed at 950° C. under a nitrogen atmosphere for 10 minutes. The surface doping concentration was increased to $5 \times 10^{20} \text{cm}^{-3}$ by ion implantation of arsenic dopants. The dopant dosage was $1 \times 10^{16} \text{cm}^{-2}$ and the implant energy was 50 keV.

The wafer was rapid thermal annealed for 10 seconds at 1100° C. The pad oxide was then stripped off of the wafer by immersing the wafer in an aqueous solution of 1% hydrofluoric acid (HF) for 8 minutes.

Several wafers were prepared as described above. A thin layer of silicon dioxide ($SiO_2$) was grown on each of these wafers by heating the wafers to a temperature of 800° C. in the presence of oxygen. The thickness of the $SiO_2$ obtained on the wafers was 20 Å to 60 Å, depending upon the location of the wafer in the furnace. The $SiO_2$ thickness was verified using a transmission electron microscope. A solution of MEH-PPV was prepared by dissolving MEH-PPV in chlorobenzene at a concentration of 5 mg/ml. The MEH-PPV film was then spun onto the wafer at 800 rpm for 2 minutes. The MEH-PPV film was about 600 Å thick. A 160 Å-thick layer of semi-transparent gold was then evaporated on top of the polymer.

The light-emitting diode emitted light when a turn on voltage of 2.5 volts was applied to the device. The photodiode current was measured with a silicon photodiode. The distance between the photodiode and the device was 3.3 cm. The silicon photodiode had an area of 1 cm$^2$, and a responsivity of 0.35 amp/watt and 0.3 amp/watt at the respective wavelengths of 655 nm and 550 nm. The quantum efficiency was calculated from the measured photocurrent.

Figure 3:
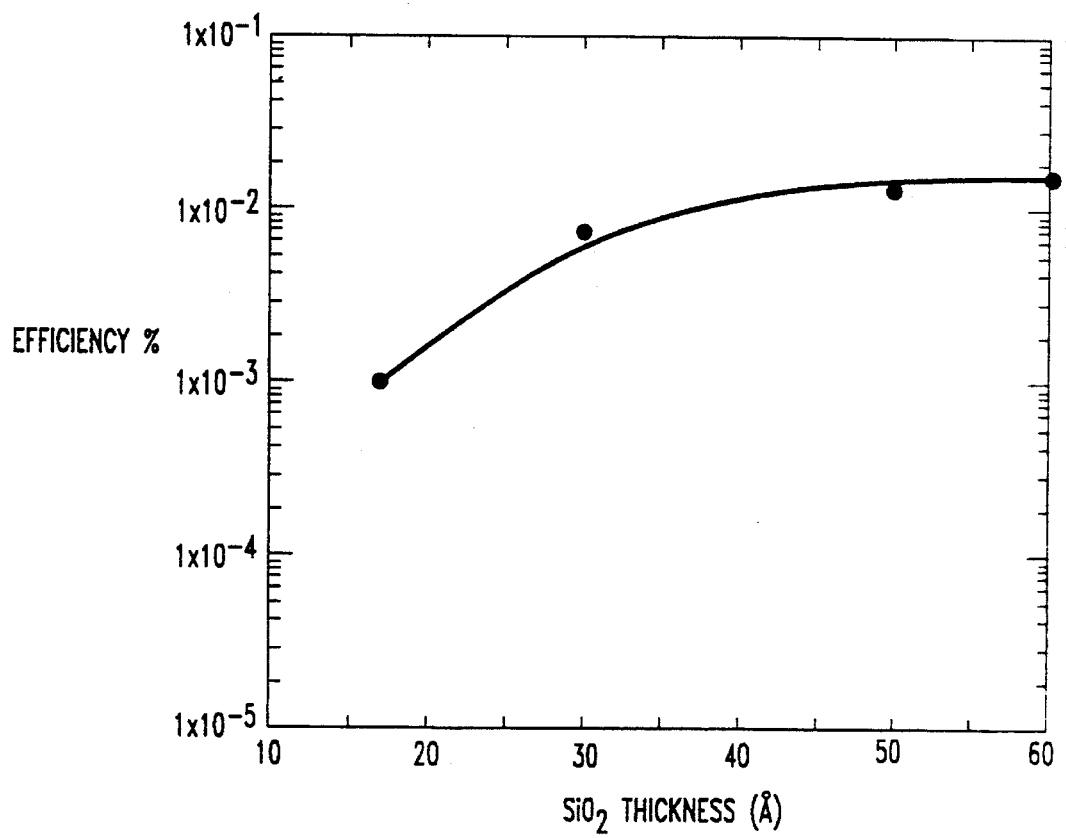
FIG. 3 illustrates the effect of the thickness of silicon dioxide on the efficiency of the LED.

FIG. 3 illustrates the effect of the thickness of the second, $SiO_2$ region on quantum efficiency of the light emitting diodes of the present invention. The quantum efficiency was calculated by determining the intensity of the light emitted by the LED for a certain input voltage. The tested devices were identical except for the $SiO_2$ thickness. The devices were formed on a silicon substrate. The cathode was a layer of n-type silicon. The semiconducting organic material was MEH-PPV and the anode was a gold electrode. FIG. 3 illustrates that if the second region of $SiO_2$ is 50 Å thick, the light emitting diode will have a quantum efficiency that is about 100 times greater than a light emitting device that does not have a third silicon dioxide region.

Figure 4:
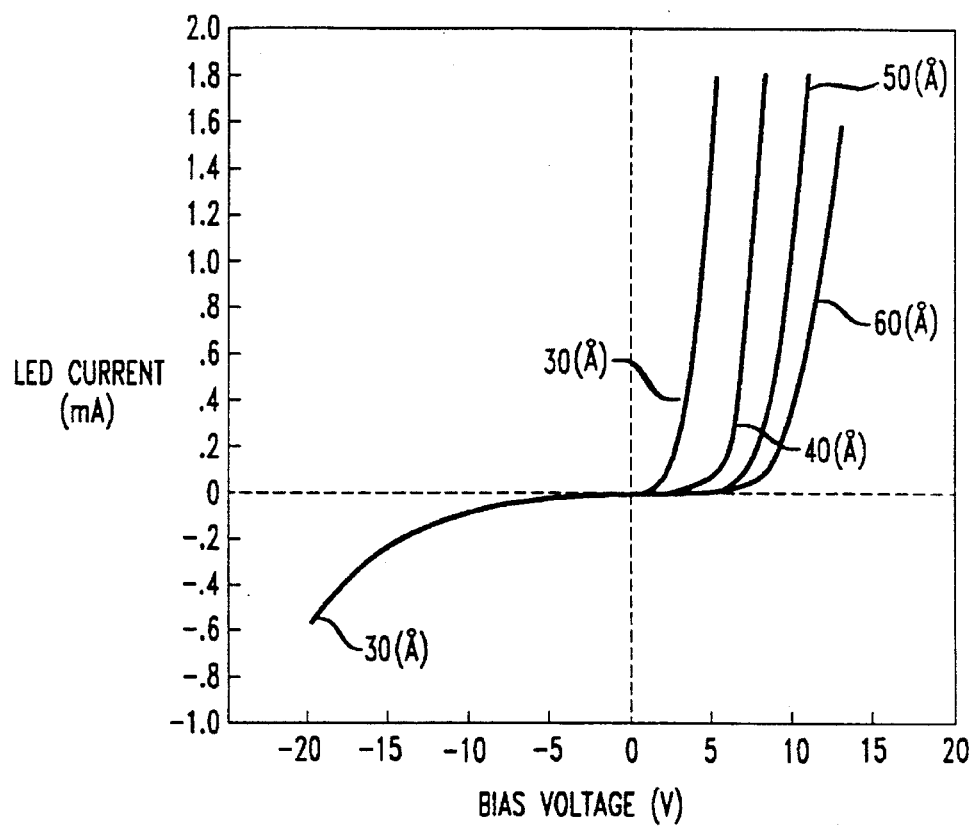
FIG. 4 illustrates the turn-on voltage of the LED of the present invention as a function of the thickness of the silicon dioxide layer in the LED.

The light-emitting diodes had a second electrode surface area of 4/mm$^2$. The bias voltage applied to the light emitting diodes was about −10 volts to 10 volts. The bias voltage is the voltage applied to the luminescent organic material from the electrode. FIG. 4 illustrates the relationship between the bias voltage and the threshold voltage (turn-on voltage) that is required to make the LED emit light. FIG. 4 illustrates that the bias voltage increases as the thickness of the oxide layer increases. The bias current was about −0.1 miliampere (mA) to about 2 mA.

EXAMPLE 2

A wafer of p-type silicon with a resistivity of about 5 to 10 ohm-cm was obtained. The wafer was then doped and a thin layer of silicon dioxide was grown thereon as described in Example 1.

A thin layer of diamine that was about 350 Å to about 750 Å thick was evaporated under vacuum (10–6 torr). The diamine was N, N'-diphenyl-N, N'-bis (3 methylphenyl)-[1, 1' biphenyl]-4, 4' diamine. A layer of 8-hydroxyquinoline was then evaporated onto the diamine layer under the same conditions. The 8-hydroxyquinoline layer had a thickness of about 350 Å to about 750 Å. A thin layer of aluminum with a thickness of about 150 Å was then evaporated over the layer of 8-hydroxyquinoline.

Figure 5:
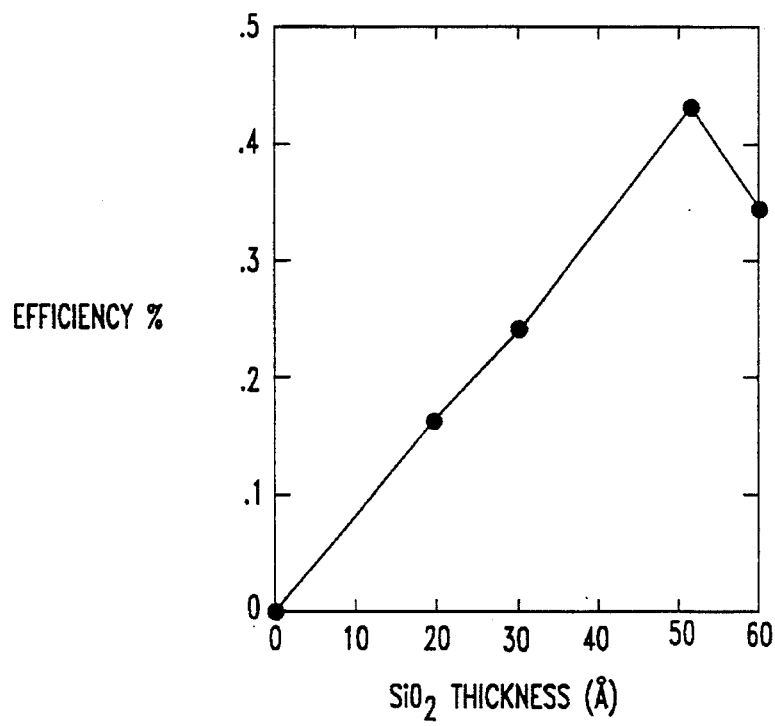
FIG. 5 illustrates the effect of the thickness of silicon dioxide on the LED efficiency.

A number of different wafers were prepared in the above described manner, except that the thickness of the silicon dioxide layer, grown on the substrate as described in Example 1, was varied from about 0 to about 50 Å. The quantum efficiency of the resultant LEDs was measured. Referring to FIG. 5, the quantum efficiency of the LED with no oxide thereon was $5 \times 10^{-5}$% percent while the efficiency of an LED with an oxide thickness of 50 Å was 0.425%.

Thus, the layer of oxide provided a marked improvement in LED efficiency.

The LED of the present invention is suitable for monolithic integration onto an integrated circuit along with other discrete components. It is also contemplated that the LED will be used in displays. Such a monolithic integration requires a transmitter and a receiver along with other Si circuits. The transmitter will typically be the LED and its driving circuits. The receiver will typically be a light detector and a trans-impedance amplifier. An example of a trans-impedance amplifier is a current-to-voltage converter with gain. The output power level of the light source must be detectable by the receiver. For example, if the output of the LED is 2 μW, a monolithic silicon receiver with a sensitivity of −45 dBm to −35 dBm is contemplated as suitable. Such a receiver will detect an optical signal from the LED even if the photodiode efficiency is about 30 percent and the coupling efficiency between the receiver and the transmitter is only about 6%.

I claim:

1. A light-emitting device comprising:

a first device region comprising silicon doped with a suitable dopant;

a third device region comprising a luminescent organic material;

a second device region interposed between said first device region and said third device region which lowers the energy barrier between the first device region and the third device region, where said second device regions has a thickness of about 20 Å to about 60 Å; and a fourth device region comprising a conductive material that is at least semi-transparent overlying the third device region wherein the luminescent organic material emits light in response to the application of a bias voltage to the light emitting device.

2. The device of claim 1 wherein the semiconducting organic material selected from the group consisting of a phenylene vinylene polymer and an organic coordination compound.

3. The device of claim 1 wherein the first device region is an n-doped silicon and the fourth device region is a positively biased metal.

4. The device of claim 3 wherein the difference between the work function of the positively biased metal and the energy level of the conduction band of the organic material is less than about 2 eV.

5. The device of claim 1 wherein the first device region is a p-doped silicon and the fourth device region is a negatively biased metal.

6. The device of claim 5 wherein the difference between the work function of the negatively biased metal and the energy level of the valence band of the organic material is about 2 eV or less.

7. The device of claim 1 wherein the device is monolithically integrated on an integrated circuit.

8. The device of claim 1 wherein the first device region is doped with a p-type dopant and holes are injected into the luminescent organic material from the first device region and through the second device region in response to the application of the bias voltage to the device.

9. The device of claim 1 wherein the first device region is doped with an n-type dopant and electrons tunnel from the first device region, through the second device region and into the luminescent organic material in response to the application of the bias voltage to the device.

* * * * *